(12) United States Patent
Doyle

(10) Patent No.: US 6,228,691 B1
(45) Date of Patent: May 8, 2001

(54) SILICON-ON-INSULATOR DEVICES AND METHOD FOR PRODUCING THE SAME

(75) Inventor: Brian Doyle, Cupertino, CA (US)

(73) Assignee: Intel Corp., Santa Clara, CA (US)

( * ) Notice: Subject to any disclaimer, the term of this patent is extended or adjusted under 35 U.S.C. 154(b) by 0 days.

(21) Appl. No.: 09/343,221

(22) Filed: Jun. 30, 1999

(51) Int. Cl.$^7$ ................................... H01L 21/339
(52) U.S. Cl. .................... 438/149; 438/517; 438/404; 438/430
(58) Field of Search ................... 438/149, 700, 438/517, 479, 430, 404, 405, 424

(56) References Cited

U.S. PATENT DOCUMENTS

| | | | |
|---|---|---|---|
| 5,707,486 | * | 1/1998 | Collins ............... 156/643.1 |
| 5,710,073 | * | 1/1998 | Jeng et al. ............ 438/239 |
| 5,960,313 | * | 9/1999 | Jun ..................... 438/624 |
| 6,077,773 | * | 6/2000 | Lin ..................... 438/637 |

* cited by examiner

Primary Examiner—Caridad Everhart
(74) Attorney, Agent, or Firm—Antonelli, Terry, Stout & Kraus, LLP

(57) ABSTRACT

A process of producing controllable thicknesses of silicon-on-insulator (SOI) for fully-depleted double-gate applications is provided. The process comprises depositing an oxide layer on a silicon wafer, depositing a nitride layer of a controlled thickness on the oxide layer, etching the nitride layer to open a first trench of controlled thickness, opening a second trench down to the silicon substrate, growing epitaxial silicon using epitaxial lateral overgrowth (ELO) to fill the second trench and grow sideways to fill the first trench, perform planarization of ELO silicon using the nitride layer as a chemical-mechanical polishing (CMP) stop layer, and fabricating a SOI device in the first trench.

30 Claims, 9 Drawing Sheets

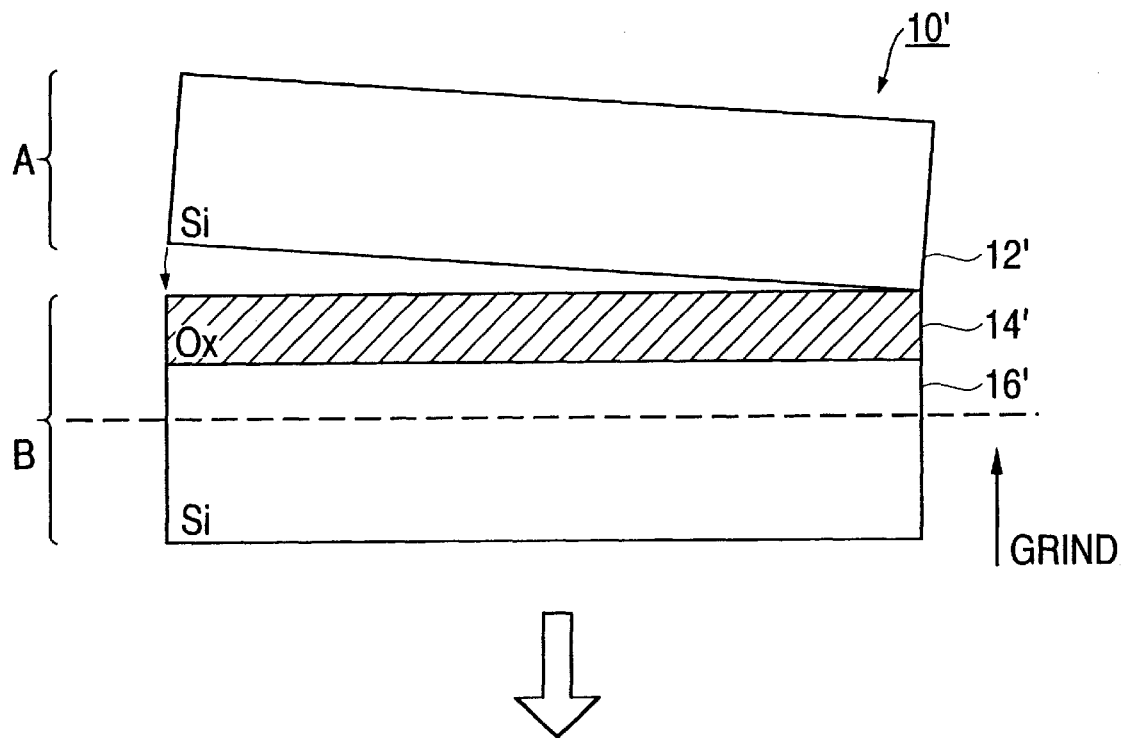
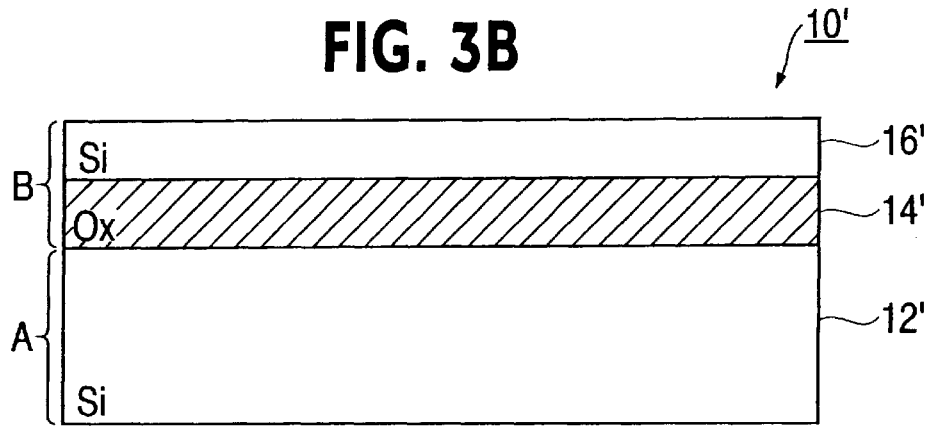

SILICON-ON-INSULATOR DEVICES AND METHOD FOR PRODUCING THE SAME

TECHNICAL FIELD

The present invention relates to a semiconductor process and, more particularly, relates to a silicon-on-insulator device and a process of producing controllable thickness for a silicon layer of a silicon-on-insulator (SOI) device.

BACKGROUND

Silicon-on-insulator (SOI) substrates have recently become desirable for many technologies, including extreme scaling of metal-oxide semiconductor (MOS) and complementary metal-oxide semiconductor (CMOS) devices, advanced MOS junction-type field-effect transistors (MOSFETs), and quantum wires and dots. This is primarily because SOI fabrication processes result in increased packing densities, improved performances, better device isolations and reduced extrinsic parasitic elements, particularly those of the source and drain as well as leakage currents and thus significantly speeding up circuit operations.

As the name implies, SOI substrates generally comprise a thin layer of silicon on top of an insulator, wherein circuit components are formed in and on the thin layer of silicon. The insulator can be silicon oxide ($SO_2$), sapphire, or any appropriate material. For example, a sapphire substrate may be used as an insulator for target radio-frequency (RF) applications. In contrast, a bulk silicon wafer with an oxide layer as the substrate may be used as an insulator for target digital logic applications. In both cases, the insulator may serve to reduce junction capacitance between the heavily-doped devices and the lightly-doped bulk substrate which may translate to less power consumption and greater circuit speed.

SOI substrate may be fully-deleted in which a depletion region of an entire channel is fully active, or may be partially-depleted in which the depletion region of the channel is not fully active. In both partially or fully depleted devices, the silicon layer may be thinner than the depletion region. However, fully-depleted SOI substrates have rarely been used in the fabrication of SOI MOSFETs, for example. This is because the uniform thickness control of the silicon layer of a SOI substrate on which the channel is formed for fully-depleted SOI substrates has been exceedingly difficult. Variation in the thickness of the silicon layer can severely impact the threshold voltage of each transistor on the SOI substrate. Consequently, partially-depleted (PD) SOI substrates have widely been used instead.

Currently, there are several techniques available for the fabrication of SOI substrates. An established technique for fabricating SOI substrates is known as "separation by implantation of oxygen" (SIMOX), where oxygen is implanted below the silicon surface and the substrate is annealed to provide a buried silicon oxide layer with a silicon overlayer. The implantation time can be intensive and cost prohibitive. Moreover, the SOI substrate may be exposed to high surface damage and contamination. A second technique is known as "bond-and-etch-back" SOI (BESOI), where an oxidized wafer is first diffusion-bonded to an unoxidized wafer, and the backside of the oxidized wafer is then grinded, polished, and etched to the desired device layer. The BESOI approach may be free from the implant damage inherent in the SIMOX approach. However, time consuming sequence of grinding, polishing, and etching may be required. Another technique is known as the hydrogen implantation and separation approach (also called Smart-Cut®), where hydrogen is implanted into silicon with a thermally grown oxide to form embrittlement of the silicon substrate underneath the oxide layer. The implanted wafer may then be bonded with another silicon wafer with an oxide overlayer. The bonded wafer may be "cut" across the wafer at the peak location of the hydrogen implant by appropriate annealing. These fabrication techniques may not be suitable for fabricating fully-depleted SOI substrates, since the uniform thickness of the silicon layer of a SOI substrate may be difficult to achieve.

More complex techniques for fabricating filly-depleted SOI devices include the selective epitaxial growth (SEG) and epitaxial lateral overgrowth (ELO) technique as described in "*SOI-MOSFET Structures Using Silicon Selective (SEG) and Epitaxial Lateral Overgrowth (ELO)*" by Gerold W. Neudeck, submitted to Semiconductor Research Corporation, May 1997, and the combination of BESOI and Smart-Cut® as described in "Ultra-Cut: A Simple Technique For The Fabrication Of SOI Substrates With Ultra-Thin (<5 nm) Silicon Films" by K. D. Hobart et al., Naval Research Laboratory, published by the IEEE International SOI Conference Proceedings, October 1998. However, none of these techniques appears to be simple, cost-effective, and efficient for fabricating fully-depleted SOI devices. Variation in the uniform thickness of the silicon layer may still be unacceptable and can still impact the threshold voltage of each transistor (memory cell) on the SOI substrate. Accordingly, there is a need for a simple approach to producing highly controlled thicknesses for the silicon layer of SOI substrates for fully-depleted applications.

SUMMARY

Accordingly, various embodiments of the present invention are directed to a process of fabricating a silicon-on-insulator (SOI) substrate. Such a process comprises forming a dielectric layer on a surface of a semiconductor wafer; forming a barrier layer having a hardness substantially greater than the dielectric layer, on the dielectric layer; forming a first trench through a portion of the barrier layer; forming a second trench through the barrier layer and the dielectric layer to expose a portion of the semiconductor wafer; growing a silicon layer from the exposed portion of the semiconductor wafer to fill the second trench and the first trench; and planarizing the silicon layer using the barrier layer as a polish-stop layer to isolate the silicon within the first trench from the silicon in the second trench.

BRIEF DESCRIPTION OF THE DRAWINGS

A more complete appreciation of exemplary embodiments of the present invention, and many of the attendant advantages of the present invention, will become readily apparent as the same becomes better understood by reference to the following detailed description when considered in conjunction with the accompanying drawings in which like reference symbols indicate the same or similar components, wherein:

FIGS. 3A and 3B illustrate a bond-and-etch-back SOI (BESOI) substrate manufacturing process of fabricating a SOI substrate;

DETAILED DESCRIPTION

The present invention is applicable for use with all types of semiconductor substrates and silicon-on-insulator (SOI) devices, including, for example, MOS transistors, CMOS devices, dual-gate MOSFETs, and new memory devices which may become available as semiconductor technology develops in the future. However, for the sake of simplicity, discussions will concentrate mainly on exemplary use of a simple silicon-on-insulator (SOI) substrate, although the scope of the present invention is not limited thereto.

Figure 1:
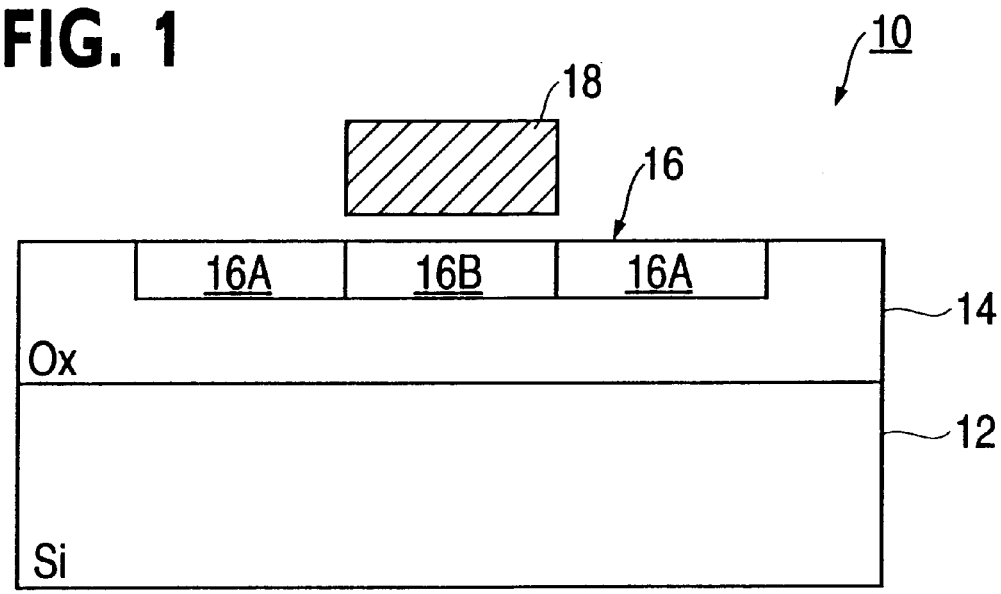
FIG. 1 illustrates an example silicon-on-insulator (SOI) substrate.

Attention now is directed to the drawings and particularly to FIG. 1, an example silicon-on-insulator (SOI) substrate 10 is illustrated. As shown in FIG. 1, the SOI substrate 10 may comprise a semiconductor wafer 12, a dielectric layer 14 (such as $SiO_2$ and the like) formed on the main surface of the semiconductor substrate 12 to reduce capacitance, a silicon layer 16 (known as a SOI layer) having a desired thickness formed on the dielectric layer 14. The semiconductor wafer 12 can be silicon, sapphire, or any appropriate material. Formed on the silicon layer 16 is a SOI device comprised of source/drain regions 16A, a channel region 16B and a gate electrode 18. The SOI device may represent, for example, an NMOS transistor or a pMOS transistor in which the dopant impurity regions 16A may be heavily doped with high concentration of either n-type of impurity or p-type of impurity. High concentration impurity ions may be implanted in the silicon layer 16 using a mask to form the dopant impurity regions 16A. In either case, the dielectric layer 14 may serve to reduce junction capacitance between the heavily-doped SOI device and the non-doped or lightly-doped silicon wafer 12 in order to reduce power consumption and obtain greater circuit speed.

As shown in FIG. 1, the SOI substrate may be fully-deleted or partially-depleted. However, for reliable non-varied operation, the silicon layer 16 must be thinner than the depletion region, and the thickness of the silicon layer 16 on which the channel is formed must be uniformly controlled. Otherwise, the threshold voltage of the SOI device may be varied and as a result, the performance of the SOI device may be degraded. The characteristic of the threshold voltage of the SOI device, such as a MOS transistor or MOSFET, may be described in detail hereinbelow.

Generally the threshold voltage (Vth) of the SOI device can be expressed as follows:

$$V_{th}=V_{FB}+Q_B/C_{OX},$$

where $V_{th}$ represents a threshold voltage, $V_{FB}$ represents a flat band voltage, $Q_B$ represents bulk charge, and $C_{OX}$ represents capacitance of the dielectric layer 14.

Referring to the above equation, the amount of charge in the channel may vary depending on the thickness of the silicon layer 16. For example, the threshold voltage of the SOI device decreases as the thickness of the silicon layer is reduced. Accordingly, a variation in thickness of the silicon layer directly influences the threshold voltage of the SOI device. Consequently, the thickness of the silicon layer 16 of a SOI substrate 10 must be uniformly and accurately controlled during its formation (e.g., from SOI device to SOI device across a chip) to avoid variations in the threshold voltage of the SOI devices.

The SOI substrate 10 of FIG. 1 may be fabricated by several different techniques, including separation by implantation of oxygen (SIMOX), bonding-and-etch-back SOI (BESOI), hydrogen implantation and separation (also called Smart-Cut®), and selective epitaxial growth (SEG) and epitaxial lateral overgrowth (ELO). However, none of these techniques may be simple, cost-effective, and efficient for fabricating fully-depleted SOI devices while uniformly and accurately controlling the thickness of the silicon layer 16.

Figure 2:
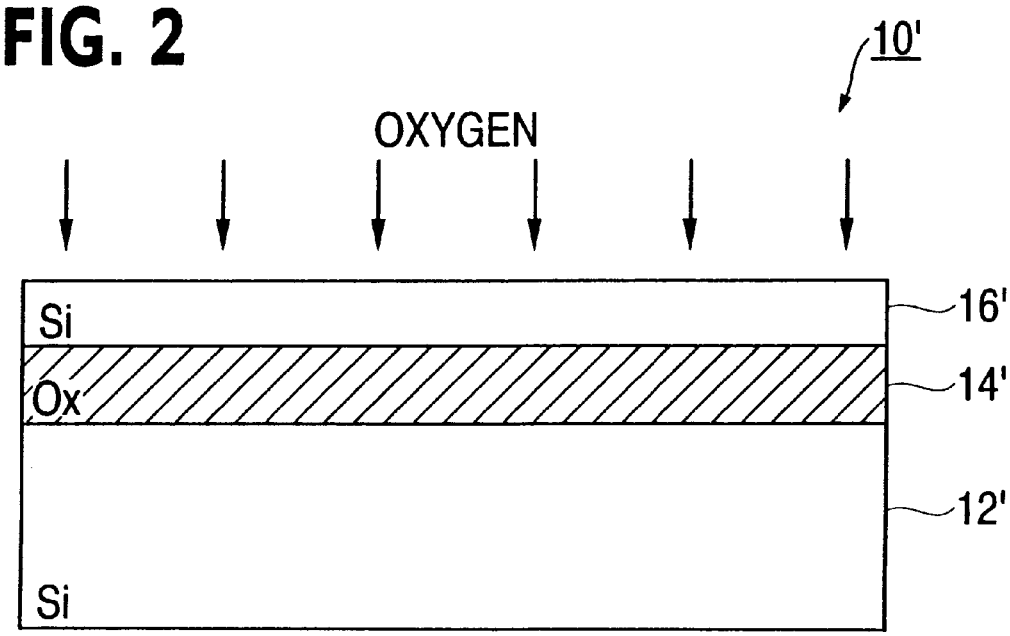
FIG. 2 illustrates a separation by implantation of oxygen (SIMOX) substrate manufacturing process of fabricating a SOI substrate.

For example, FIG. 2 illustrates a separation by implantation of oxygen (SIMOX) substrate manufacturing process of fabricating a SOI substrate 10'. As shown in FIG. 2, high-dose oxygen ions 20 may be implanted into the single-crystal silicon wafer 12' and a high temperature anneal processing may be used to cause a portion of the silicon atoms within the silicon wafer 12' and the implanted oxygen ions 20 to react, so that a buried oxide layer 14' is formed in the silicon wafer 12' with a silicon overlayer 16'. For example, for high-dose oxygen implantation, an implantation energy of 150–200 KeV, an ion dose of approximately $2 \times 10^{18}/cm^2$ with substrate temperature greater than 600° C. may be used. The high dose oxygen implantation may then be followed by high annealing temperature of greater than 1300° C. for at least 8 hours. For low dose oxygen implantation, lower dose of oxygen of approximately $4 \times 10^{17}/cm^2$ and annealing atmosphere of inert gas such as argon (Ar) and oxygen ($O_2$) may be used. The temperature and oxidation time period may be increased or decreased in proportion to the thickness of the buried oxide layer. However, the SIMOX approach can lead to thickness non-uniformity, and can also be cost prohibitive. Moreover, the SOI substrate 10' may be exposed to high surface damage and contamination.

FIGS. 3A and 3B illustrate a bond-and-etch-back SOI (BESOI) substrate manufacturing process of fabricating a SOI substrate. As shown in FIG. 3A, two separate silicon substrates (wafers) A and B may be used for diffusion bonding and then grinded, polished and etched to the desired silicon layer. For example, the surface of the second silicon substrate B may be oxidized to form an oxide layer 14'. Oxide may be formed by thermal oxidation or chemical vapor deposition (CVD). The oxidized silicon substrate B may then be diffusion-bonded to an unoxidized silicon substrate A at the oxidized surface. After the oxidized, second silicon substrate B is bonded to the unoxidized, first silicon substrate A, and the backside of the oxidized substrate B may then be grinded, polished, and etched to the desired silicon layer 16' as shown in FIG. 3B. BESOI substrates may avoid the implant damage inherent in the SIMOX approach. However, the BESOI approach may be time consuming since a laborous sequence of grinding, polishing, and etching is required. In addition, substantial silicon may be wasted. Moreover, uniform thickness of both the silicon layer 16' and oxide layer 14' may be difficult to achieve.

Figure 4A:
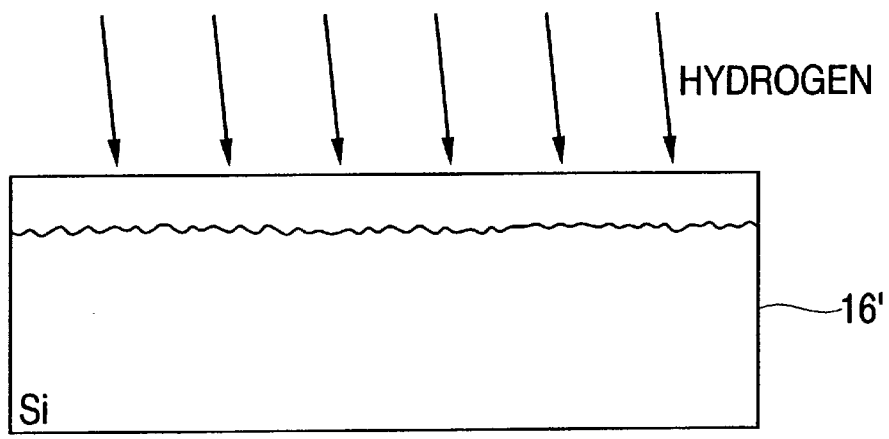
FIGS. 4A–4C illustrate a hydrogen implantation and separation (Smart-Cut®) substrate manufacturing process of fabricating a SOI substrate.
Figure 4B:
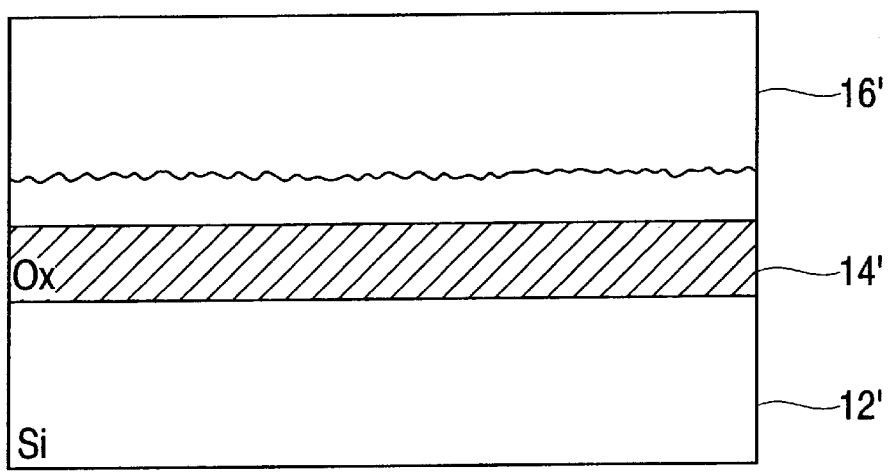
Figure 4C:
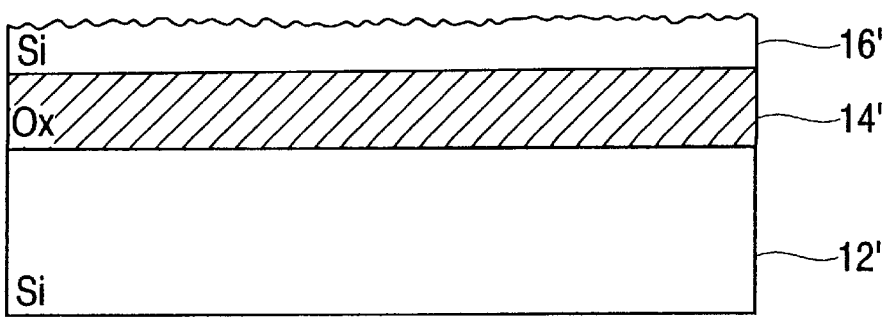

FIGS. 4A–4C illustrate a hydrogen implantation and separation (Smart-Cut®) substrate manufacturing process of fabricating a SOI substrate 10'. As shown in FIG. 4A, heavy dose of hydrogen ions 22 may be implanted into the silicon wafer 12' with a thermally grown oxide to form embrittlement 24 in the silicon above the oxide layer 14'. The implanted wafer may then be bonded with another silicon wafer with an oxide layer 14' as shown in FIG. 4B. The bonded wafer may be "cut" across the wafer at the peak location of the hydrogen implant by appropriate annealing, as shown in FIG. 4C, to form the silicon layer 16'. The Smart-Cut® approach may not be suitable for fabricating fully-depleted SOI substrates, however, since the uniform thickness of the silicon layer 16' of the SOI substrate 10' may still be difficult to obtain.

Figure 5A:
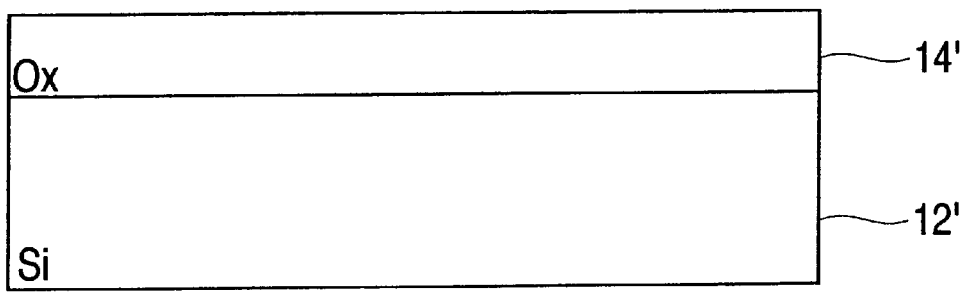
FIGS. 5A–5E illustrate a selective epitaxial growth (SEG) and epitaxial lateral overgrowth (ELO) substrate manufacturing process of fabricating a SOI substrate.
Figure 5B:
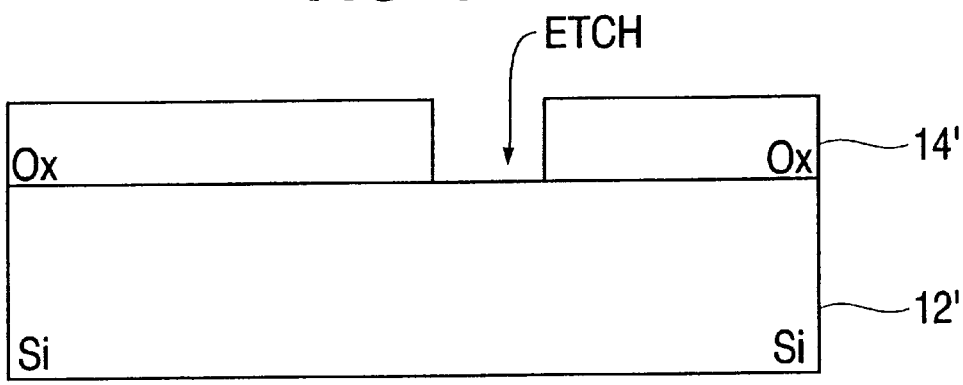
Figure 5C:
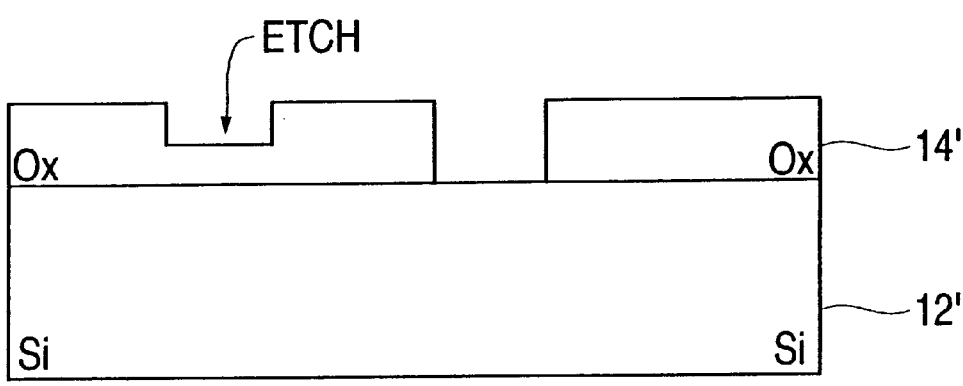
Figure 5D:
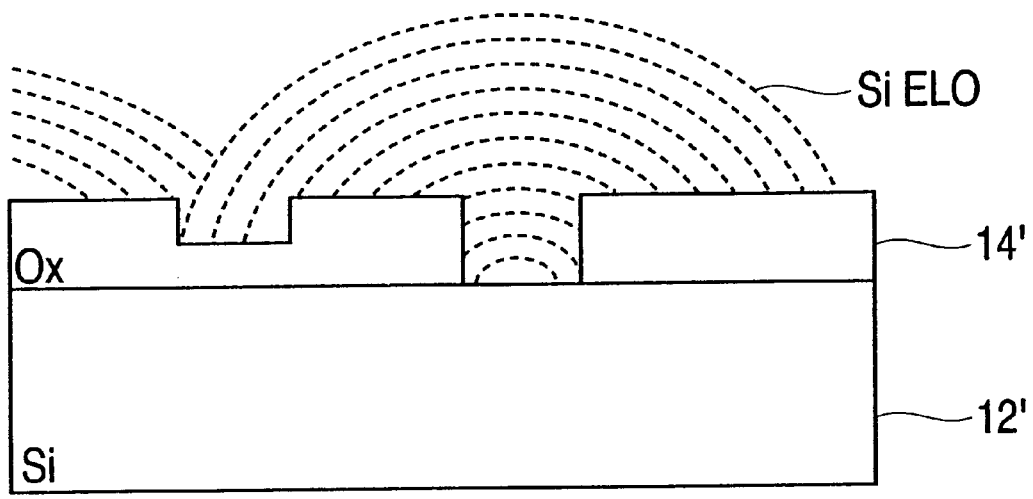
Figure 5E:
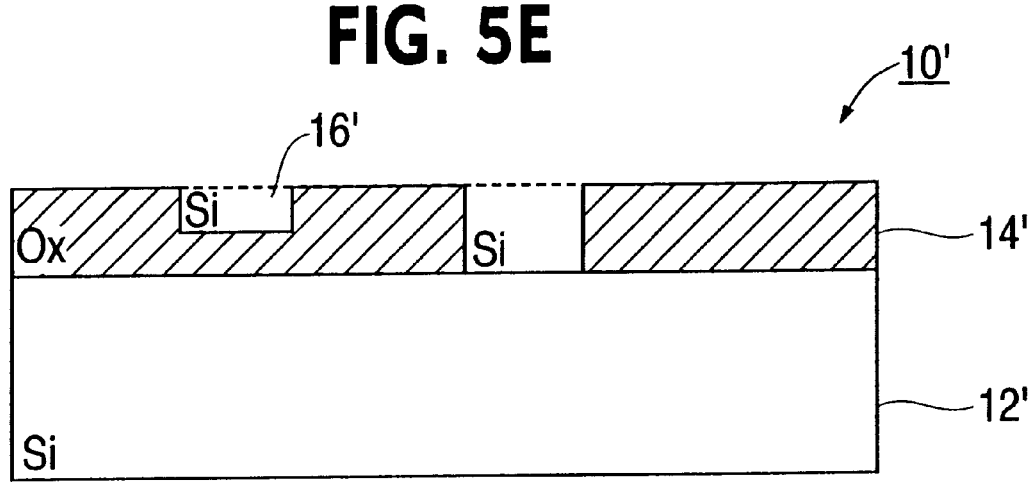

FIGS. 5A–5E illustrate a selective epitaxial growth (SEG) and epitaxial lateral overgrowth (ELO) substrate manufacturing process of fabricating a SOI substrate 10'. As shown in FIG. 5A, an oxide layer 14' may first be formed on the surface of a silicon wafer 12' by way of thermal oxidation or chemical vapor deposition (CVD). The oxide layer 14' may be etched using an etch mask for exposing a portion of the silicon wafer 12' corresponding to a seed hole 26 as shown in FIG. 5B. Next, the oxide layer 14' may be re-etched using another etch mask for forming a recess (oxide trench) 28 in a portion of the silicon wafer 12' corresponding to a SOI device region to be formed as shown in FIG. 5C. Thereafter, epitaxial lateral overgrowth (ELO) silicon 32 may then be grown out of the seed hole 26 and over and down into the recess 28 as shown in FIG. 5D. Finally, the excess of silicon ELO may be polished away (i.e., removed), using the oxide layer 14' as a polish stop, to isolate a silicon layer 16' from the silicon residing in the seed hole 26 as shown in FIG. 5E. The thickness of the silicon layer 16' may depend on the etching of the oxide layer 14'. As a result, variation in the depth of etching may still impact the thickness of the silicon layer 16' of a SOI substrate 10'. More particularly, since an oxide layer 14' is not a particularly good polish stop material, depth variations may occur between silicon layers 16' on a single SOI substrate 10' and/or between silicon layer 16' on separate SOI substrates 10' (resulting in inconsistent products).

A more complex approach to fabricating a SOI substrate 10' may be a combination of the BESOI technique shown in FIGS. 3A–3B and the Smart-Cut® technique shown in FIGS. 4A–4C as described in *"Ultra-Cut: A Simple Technique For The Fabrication Of SOI Substrates With Ultra-Thin (<5 nm) Silicon Films"* by K. D. Hobart et al. Using this complex approach, the thickness of the silicon layer may be controlled by depositing SiGe epitaxial layer on a silicon wafer, growing highly controllable silicon layer on top of the SiGe epitaxial layer, implanting hydrogen into the SiGe epitaxial layer, transferring the delaminated layer of silicon and SiGe onto an oxidized silicon wafer, and etching the exposed SiGe to leave behind the highly controlled silicon layer adhered to the oxide.

Turning now to FIGS. 6A–6F, a simplified approach to producing highly controlled thicknesses of SOI for fully-depleted applications according to an embodiment of the present invention is illustrated. In contrast to the SEG-ELO approach of FIGS. 5A–5E which uses oxide as a polish-stop layer, the inventive approach allows for the fabrication of highly controlled SOI substrate 100 by taking advantage of the thickness control of a deposited nitride layer, and the hardness qualities of a barrier material such as nitride as a chemically-mechanically-polishing (CMP) stop layer. As intended by the present invention, a thin and highly controllable layer of nitride (such as silicon nitride layer) may be concomitantly used both to accurately define the thickness of the thin silicon (SOI) layer, as well as to act as a polish-stop layer. This is primarily because nitride has a hardness that is greater than the hardness of the semiconductor (oxide) layer, control of film thicknesses during nitride deposition have been measured and successfully tested for thin films of 300 and 500 Angstroms which exhibit typical 3-σ uniformity better than 1%.

Figure 6A:
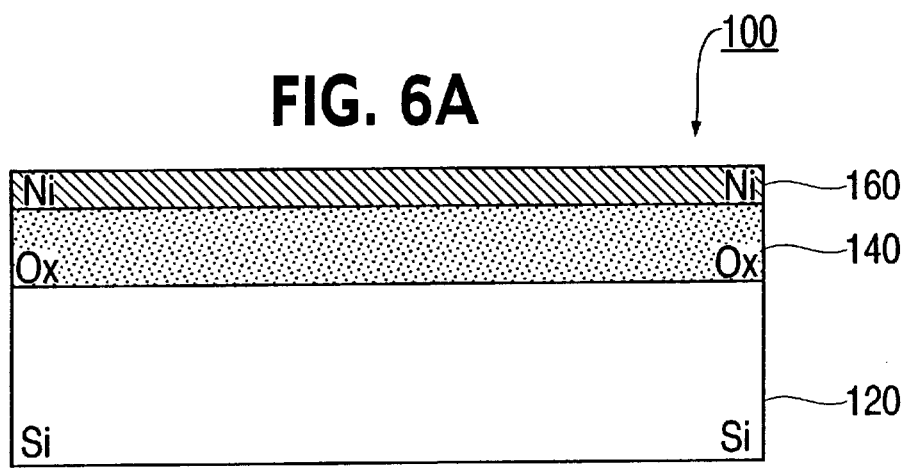
FIGS. 6A–6G illustrate a process of producing controllable thickness of silicon-on-insulator for fully-depleted double-gate applications according to the principles of the present invention.

As shown in FIG. 6A, an oxide layer 140 may be formed on the surface of a silicon wafer 120. The oxide layer 140 may have a thickness of, for example, between 500 and 10,000 Angstroms, and may be formed by thermal oxidation, or chemical vapor deposition (CVD). CVD may be used to form an oxide layer 140 from borophosphosilicate glass (BPSG), phosphosilicate glass (PSG), or borophospho tetraethylorthosilicate (BPTEOS). A nitride layer 160 may then be formed on the oxide layer 140 by, for example, chemical vapor deposition (CVD), to a thickness of between about 100 to 1000 Angstroms, and preferably between 300 to 500 Angstroms. The selectivity of nitride to oxide may be 9:1. As intended by the present invention, the nitride layer 160 may act as a polish-stop layer and determine the eventual thickness of the silicon layer (SOI island) to be formed.

Figure 6B:
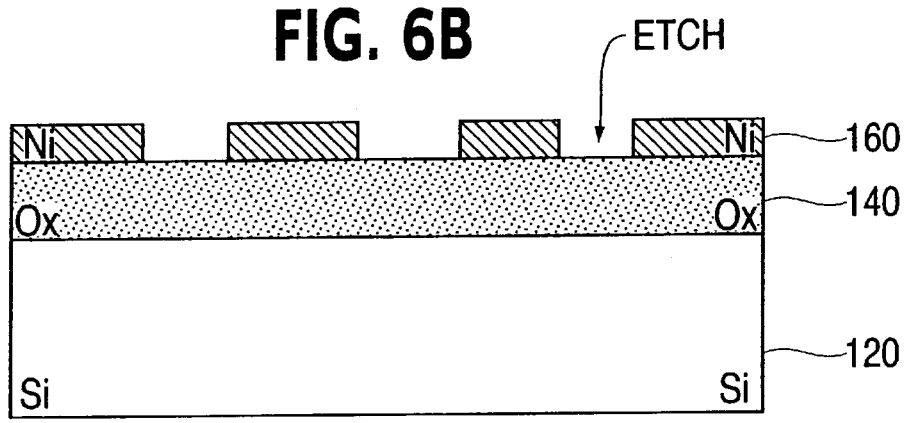

Photo-resist (not shown) may then deposited over the nitride layer 160 and may be patterned by conventional lithography and etching using an etch mask for exposing portions of the silicon wafer 120 corresponding SO1 device regions. The nitride layer 160 may be selectively etched, using the underlying oxide layer 140 as an etch stop, to form a series of first (SOI island) trenches 150 as shown in FIG. 6B. These SOI island trenches 150 may be used for epitaxial lateral overgrowth (ELO) of silicon (Si) and determine the eventual thickness of the SOI device region. The thickness of these trenches may be controlled directly by the controlling the thickness of the nitride layer 140. For example, if the nitride layer 140 exhibits a thickness of 500 Angstroms, then the depth of the SOI island trenches 150 defined by the etch mask also exhibits the same thickness of 500 Angstroms. Selected portions of the nitride layer 140 may be removed by wet or dry etching. In particular, the nitride layer 140 may be dry etched by gases of either chlorine ($Cl_2$) or helium (He) in a chemical vapor deposition (CVD) machine. However, other etching techniques may also be used for etching the nitride layer 140. For example, nitride layer 140 may also be removed by etching with phosphoric acid ($H_3PO_4$). Alternatively, the nitride layer 140 may be removed by reactive ion etching (RIE) process employing a fluoride etching gas.

Figure 6C:
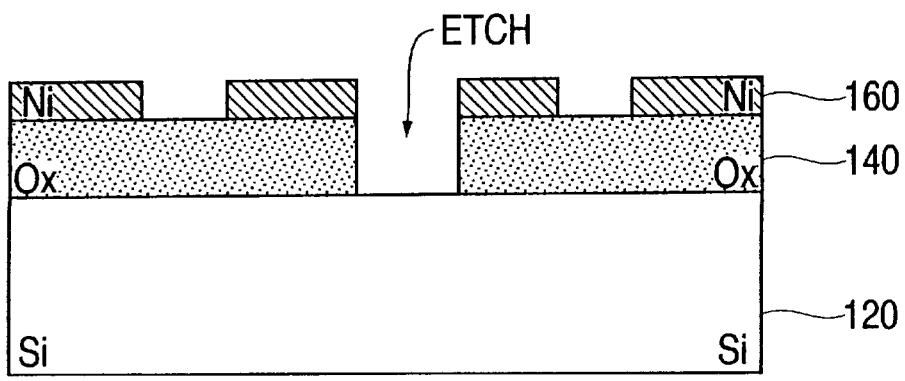

Next, the nitride layer 140 may further be etched, using the underlying silicon layer 120 as an etch stop, to form second (seed) trenches 170, as shown in FIG. 6C. These seed trenches 170 serve as the seed layer for epitaxial lateral overgrowth (ELO) of silicon Si. The seed trenches 170 may be wet etched or etched by the RIE process. The RIE process may consist of a 200 W, 80 mTorr, $CHF_3$ plasma etch.

Figure 6D:
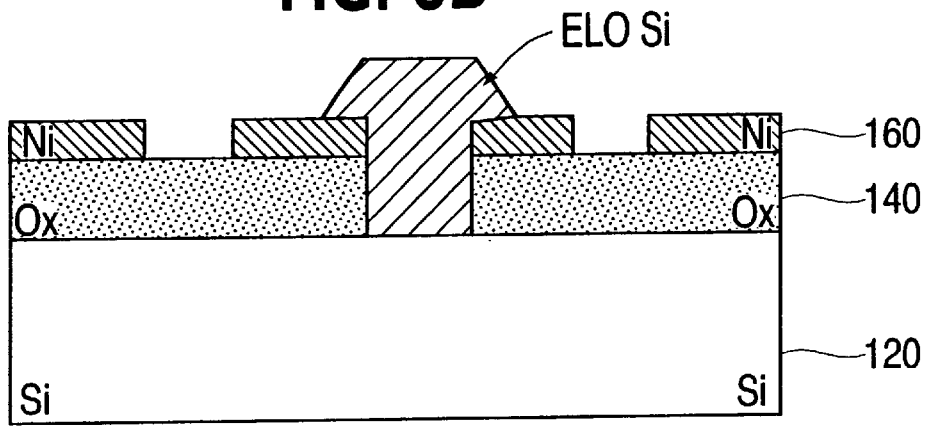
Figure 6E:
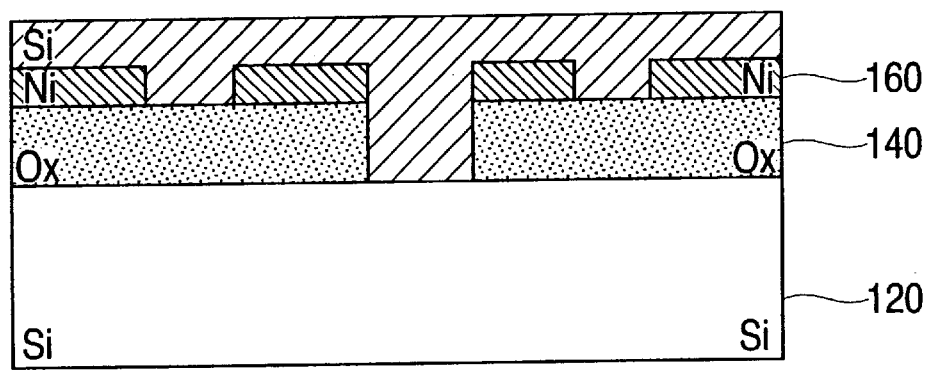
Figure 6F:
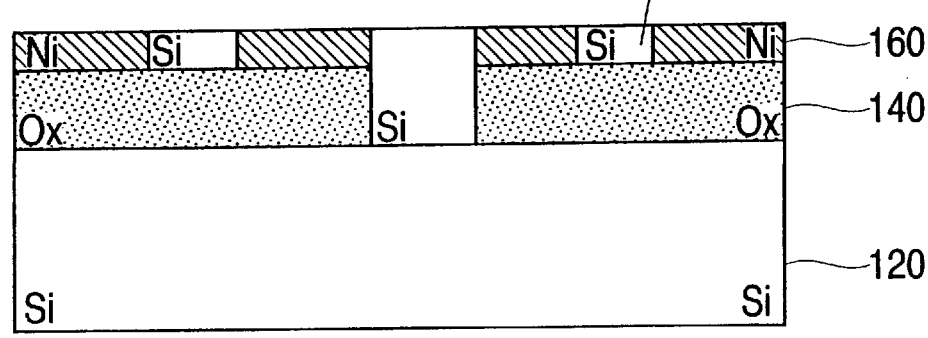

Referring to FIGS. 6D–6E, the epitaxial lateral overgrowth (ELO) of silicon 155 may be deposited into the seed trenches 170, and grown over the SOI island trenches 150 using a standard commercial RF heated low-pressure chemical vapor deposition (LPCVD) reactor at, for example, 970° C. at 40 Torr with dichlorosilane, hydrogen, and HCl.

The ELO-grown Si layer may now be removed, preferably be chemically/mechanically polished back, using the nitride layer 160 as an effective polish-stop layer, to form the SOI island regions 180 and provide device isolation between the SOI island regions 180. The chemicalmechanical polishing (CMP) machine may be a dual platen (polish platen and buff platen) machine. The epitaxial overgrowth required to be polished may be approximately 0.3 microns. A normal polish rate of silicon of 1 micron/minute may be used. Since nitride is much harder than silicon, the thickness (depth)

control of the SOI island regions 180 may be completely determined by the thickness control of the originally-deposited nitride layer 160. As a result, the thickness of the SOI island regions 180 may be uniformly and accurately controlled by using the nitride layer 160 as a CMP polish-stop layer.

Figure 6G:
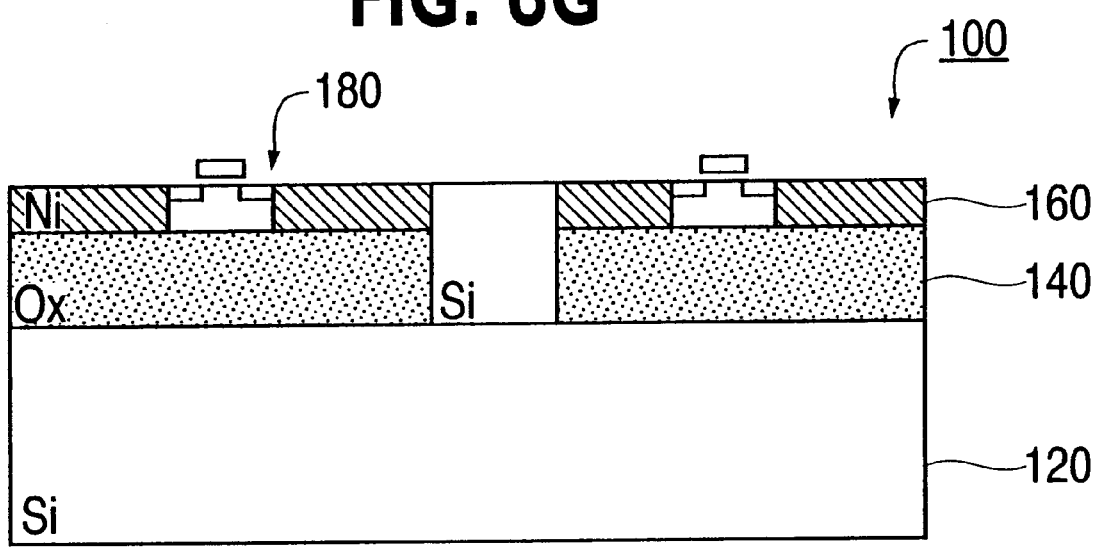

After the SOI island regions 180 may be formed, SOI devices may be now fabricated in the SOI island regions 180 as shown in FIG. 6G.

Figure 7:
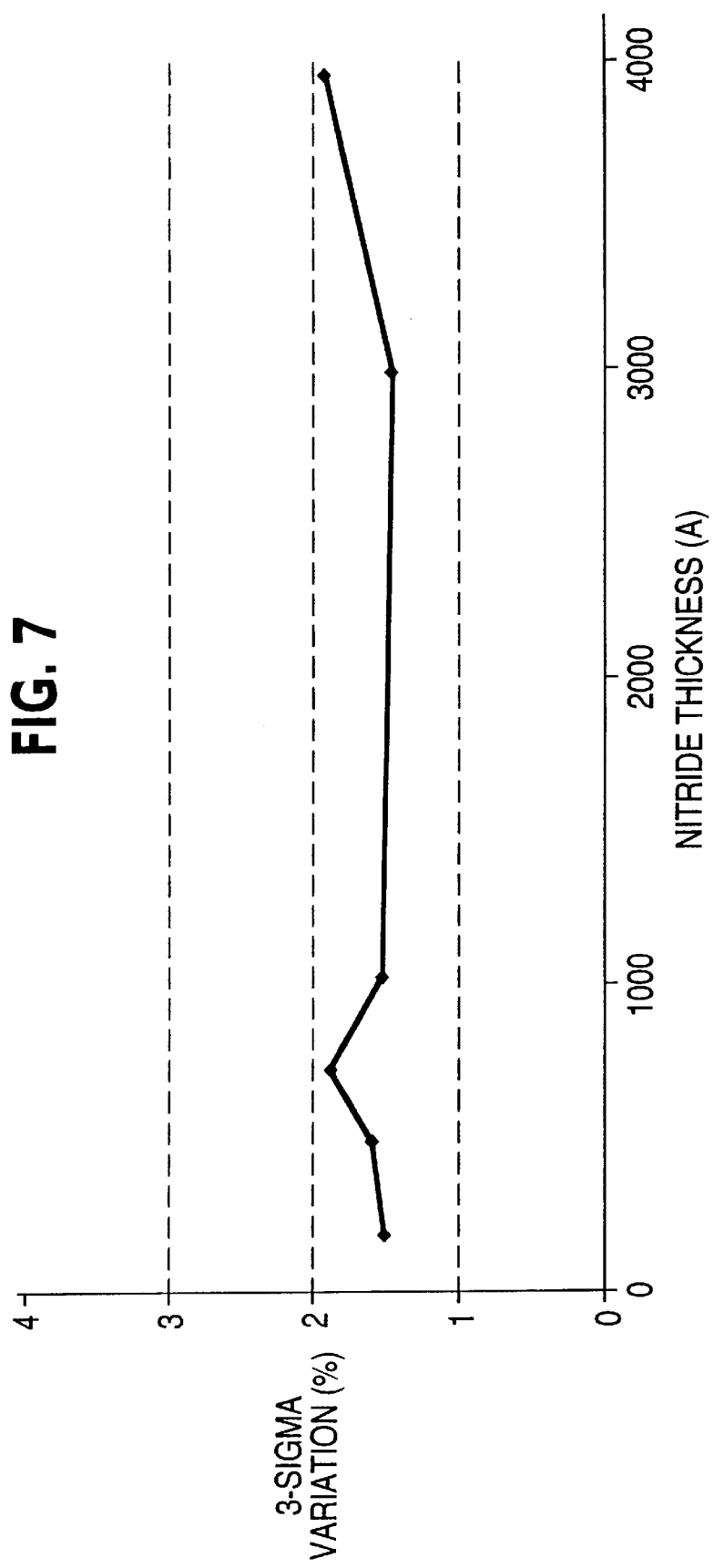
FIG. 7 illustrates variations of a film thickness as a function of deposited nitride thickness according to the principles of the present invention.

FIG. 7 illustrates variations of a film thickness as a function of deposited nitride thickness according to the principles of the present invention. Control of film thicknesses during nitride deposition have been measured, and successfully tested as shown in FIG. 7 for thin films of nitride having a thickness of approximately 300 to 500 Angstroms which exhibit typical 3-Sigma ($\sigma$) uniformity better than 1%.

As described from the foregoing, the present invention provides a simplified, cost-effective approach for fabricating fully-depleted SOI devices while uniformly and accurately controlling the thickness of the silicon (SOI) layer by using a thin and highly controllable layer of nitride both to accurately define the thickness of the silicon (SOI) layer, as well as to act as a polish-stop layer.

While there have been illustrated and described what are considered to be exemplary embodiments of the present invention, it will be understood by those skilled in the art and as technology develops that various changes and modifications may be made, and equivalents may be substituted for elements thereof without departing from the true scope of the present invention. For example, other types of semiconductor materials may be used in lieu of nitride to define the thickness of the silicon (SOI) layer, and to act as a polish-stop layer as long as such semiconductor materials exhibit a hardness that is substantially greater than the hardness of the semiconductor (oxide) layer. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A process of fabricating a silicon-on-insulator(SOI) substrate, comprising:
    forming a dielectric layer on a surface of a semiconductor wafer;
    forming a barrier layer having a hardness substantially greater than the dielectric layer, on the dielectric layer;
    forming a first trench through a portion of the barrier layer;
    forming a second trench through the barrier layer and the dielectric layer to expose a portion of the semiconductor wafer;
    growing a silicon layer from the exposed portion of the semiconductor wafer to fill the second trench and the first trench;
    planarizing the silicon layer using the barrier layer as a polish-stop layer to isolate the silicon within the first trench from the silicon in the second trench; and
    forming a silicon-on-insulator (SOI) device in the silicon within the first trench.

2. The process as claimed in claim 1, wherein said dielectric layer corresponds to an oxide layer exhibiting a thickness of 500 to 10,000 Å, and said barrier layer corresponds to a nitride layer exhibiting a thickness of 100 to 1000 Å.

3. The process as claimed in claim 1, wherein said dielectric layer corresponds to an oxide layer and said barrier layer corresponds to a nitride layer exhibiting a thickness of 300 to 500 Å and having a hardness that is substantially greater than that of said oxide layer.

4. The process as claimed in claim 3, wherein said nitride layer is dry-etched using gas flows of one of $Cl_2$ and He in a chemical vapor deposition reactor to form the first and second trenches.

5. The process as claimed in claim 3, wherein said nitride layer is reactive ion etched (RIE) to form the first and second trenches.

6. The process as claimed in claim 3, wherein a selectivity of said nitride layer to said oxide layer is 9 to 1.

7. The process as claimed in claim 3, wherein said first trench is formed by etching said nitride layer at a first predetermined pattern using a photo-resist mask.

8. The process as claimed in claim 3, wherein said oxide layer is deposited on the surface of the semiconductor wafer by one of thermal oxidation and chemical vapor deposition (CVD), said nitride layer is deposited on the oxide layer by chemical vapor deposition (CVD), and said silicon layer is grown from the exposed portion of the semiconductor wafer using epitaxial lateral overgrowth (ELO).

9. A process of producing controllable thicknesses of a silicon-on-insulator (SOI) device, comprising:
    forming an oxide layer on top of a substrate;
    depositing a nitride layer on the oxide layer exhibiting a controlled thickness which determines a desired thickness of a SOI island region;
    etching the nitride layer using a first etch mask for exposing a portion of the substrate corresponding to the SOI island region, and using the oxide layer as an etch stop to form a first trench having a depth which corresponds to the controlled thickness of the nitride layer;
    etching the nitride layer using a second etch mask for exposing another portion of the substrate corresponding to an isolation region, and using a surface of the substrate as an etch stop to form a second trench which acts as a seed hole for an epitaxial lateral overgrowth (ELO);
    growing epitaxial silicon using said epitaxial lateral overgrowth (ELO) over the second trench extending down into the first trench;
    chemically-mechanically polishing (CMP) using the nitride layer as a polish stop to isolate SOI islands of said controlled thickness over the first trench from the seed hole; and
    fabricating a SOI device over the SOI island region in the first trench.

10. The process as claimed in claim 9, wherein said nitride layer exhibits said controlled thickness of 300 to 500 Å, and has a hardness that is substantially greater than that of said oxide layer.

11. The process as claimed in claim 9, wherein said nitride layer is dry-etched using gas flows of one of $Cl_2$ and He in a chemical vapor deposition reactor to form the first and second trenches.

12. The process as claimed in claim 9, wherein said nitride layer is reactive ion etched (RIE) to form the first and second trenches.

13. The process as claimed in claim 9, wherein a selectivity of said nitride layer to said oxide layer is 9 to 1.

14. The process as claimed in claim 9, wherein said first trenches are formed by etching said nitride layer at said first predetermined pattern using a photo-resist mask.

15. The process as claimed in claim 9, wherein said oxide layer is deposited on the surface of the substrate by one of thermal oxidation and chemical vapor deposition (CVD), and wherein said nitride layer is deposited on the oxide layer by chemical vapor deposition (CVD).

16. A process of producing controllable thicknesses of silicon-on-insulator (SOI) device, comprising:

forming a first dielectric layer on a surface of a substrate;

depositing a second dielectric layer on said first dielectric layer, said second dielectric layer exhibiting a hardness that is substantially greater than that of said first dielectric layer and a controlled thickness that determines a desired thickness of silicon-on-insulator (SOI) islands;

etching said second dielectric layer at a first predetermined pattern using said first dielectric layer as an etch stop to form first trenches each exhibiting a depth which corresponds to the controlled thickness of said second dielectric layer;

etching said second dielectric layer at a second predetermined pattern using the surface of the substrate as an etch stop to form second trenches which act as seed holes for an epitaxial lateral overgrowth (ELO);

growing a third dielectric layer using said epitaxial lateral overgrowth (ELO) over the second trenches extending down into the first trenches;

polishing said epitaxial lateral overgrowth (ELO) of said third dielectric layer using said second dielectric layer as a polish stop to isolate said silicon-on-insulator (SOI) islands of said controlled thickness over the first trenches from the seed holes; and fabricating silicon-on-insulator (SOI) devices over said silicon-on-insulator (SOI) islands in the first trenches.

17. The process as claimed in claim 16, wherein said first dielectric layer corresponds to an oxide layer, said second dielectric layer corresponds to a nitride layer, and said third dielectric layer corresponds to a silicon layer.

18. The process as claimed in claim 17, wherein said nitride layer exhibits said controlled thickness of 300 to 500 Å, and has a hardness that is substantially greater than that of said oxide layer.

19. The process as claimed in claim 17, wherein said nitride layer is dry-etched using gas flows of one of $Cl_2$ and He in a chemical vapor deposition reactor to form the first and second trenches.

20. The process as claimed in claim 17, wherein said nitride layer is reactive ion etched (RIE) to form the first and second trenches.

21. The process as claimed in claim 17, wherein a selectivity of said nitride layer to said oxide layer is 9 to 1.

22. The process as claimed in claim 17, wherein said first trenches are formed by etching said nitride layer at said first predetermined pattern using a photo-resist mask.

23. The process as claimed in claim 17, wherein said oxide layer is deposited on the surface of the substrate by one of thermal oxidation and chemical vapor deposition (CVD), and wherein said nitride layer is deposited on the oxide layer by chemical vapor deposition (CVD).

24. A process of fabricating a silicon-on-insulator (SOI) substrate, comprising:

forming an oxide layer on a surface of a substrate;

depositing, on the oxide layer, a nitride layer of a thickness which determines a desired depth of a silicon-on-insulator (SOI) region;

forming a trench in a selected portion of the nitride layer;

depositing silicon in the trench to form the silicon-on-insulator (SOI) region having the desired depth determined by the thickness of the nitride layer; and forming a silicon-on-insulator (SOI) device over the silicon-on-insulator (SOI) region.

25. The process as claimed in claim 24, wherein said thickness of said nitride layer is in the range of 300 to 500 Å, and said nitride layer has a hardness that is substantially greater than that of said oxide layer.

26. The process as claimed in claim 24, wherein said nitride layer is dry-etched to form the trench using gas flows of one of $Cl_2$ and He in a chemical vapor deposition reactor.

27. The process as claimed in claim 24, wherein said nitride layer is reactive ion etched (RIE) to form the trench.

28. The process as claimed in claim 24, wherein a selectivity of said nitride layer to said oxide layer is 9 to 1.

29. The process as claimed in claim 24, wherein said trench is formed by etching said nitride layer at a predetermined pattern using a photo-resist mask.

30. The process as claimed in claim 24, wherein said oxide layer is deposited on the surface of the substrate by one of thermal oxidation and chemical vapor deposition (CVD), and wherein said nitride layer is deposited on the oxide layer by chemical vapor deposition (CVD).

* * * * *